United States Patent
Gnade

(10) Patent No.: US 8,302,302 B2
(45) Date of Patent: Nov. 6, 2012

(54) METHOD OF MANUFACTURING RESISTANCE FILM HEATING APPARATUS

(75) Inventor: Bruce Gnade, Lewisville, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 139 days.

(21) Appl. No.: 12/974,806

(22) Filed: Dec. 21, 2010

(65) Prior Publication Data

US 2011/0097960 A1 Apr. 28, 2011

Related U.S. Application Data

(62) Division of application No. 12/021,663, filed on Jan. 29, 2008, now Pat. No. 7,941,919.

(60) Provisional application No. 60/887,116, filed on Jan. 29, 2007.

(51) Int. Cl.
*H01R 43/00* (2006.01)

(52) U.S. Cl. ............... 29/857; 29/428; 29/869; 29/876; 438/149; 438/151; 438/479

(58) Field of Classification Search .................. 29/857, 29/428, 592.1, 869, 874, 876; 438/53, 106, 438/118, 149, 151, 458, 459, 479, 629, 638, 438/667
See application file for complete search history.

(56) References Cited

U.S. PATENT DOCUMENTS

| | | |
|---|---|---|
| 5,053,774 A | 10/1991 | Schuermann et al. |
| 5,287,742 A | 2/1994 | Aihara et al. |
| 5,412,593 A | 5/1995 | Magel et al. |
| 6,563,480 B1 | 5/2003 | Nakamura |
| 6,563,483 B1 | 5/2003 | Sakumoto |
| 6,727,970 B2 * | 4/2004 | Grace et al. ............ 349/187 |
| 6,747,623 B2 | 6/2004 | Koyama |
| 6,784,452 B2 | 8/2004 | Toguchi et al. |
| 6,819,310 B2 | 11/2004 | Huang et al. |
| 6,850,217 B2 | 2/2005 | Huang et al. |
| 6,856,715 B1 | 2/2005 | Ebbesen |
| 6,856,725 B2 | 2/2005 | Sillard et al. |
| 6,872,969 B2 | 3/2005 | Redecker |
| 6,952,021 B2 | 10/2005 | Tanaka et al. |
| 6,962,613 B2 | 11/2005 | Jenson |
| 6,972,526 B2 | 12/2005 | Abe |
| 7,056,620 B2 | 6/2006 | Krasnov et al. |

(Continued)

OTHER PUBLICATIONS

Gnade, B., et al., "Display Bandwidth Reduction via Latched Pixels an Processing at the Pixel," Cockpit Displays IX: Displays for Defense Applications, Darrel G. Hopper, Editor, Proceedings of SPIE (2002), vol. 4712:313-317.

*Primary Examiner* — Thiem Phan

(74) *Attorney, Agent, or Firm* — Edwin S. Flores; Chainey P. Singleton; Chalker Flores, LLP

(57) ABSTRACT

Ribbons containing e.g. inorganic NMOS devices are assembled in electrical contact with ribbons containing e.g. PMOS devices (preferably organic) to enable flexible electronic textile circuits, e.g. displays, to be inexpensive and practical for a wide for a variety of functions. The use of ribbons provides flexibility, reduces costs, and allows testing during assembly and different processes to be efficiently used for different components. This is apparently the first time that ribbons (especially inorganic-device-containing ribbons) have been interconnected to form a flexible CMOS electronic textile.

6 Claims, 2 Drawing Sheets

U.S. PATENT DOCUMENTS

| | | |
|---|---|---|
| 7,245,151 B2 | 7/2007 | Baude et al. |
| 7,564,114 B2 | 7/2009 | Govindarajan |
| 7,566,637 B2 * | 7/2009 | Farooq et al. ............... 438/462 |
| 7,712,373 B2 | 5/2010 | Nagle et al. |
| 7,871,912 B2 | 1/2011 | Jain |
| 7,941,919 B2 | 5/2011 | Gnade |

* cited by examiner

US 8,302,302 B2

METHOD OF MANUFACTURING RESISTANCE FILM HEATING APPARATUS

CROSS-REFERENCE TO RELATED APPLICATIONS

This application a divisional application of and claims priority based on U.S. patent application Ser. No. 12/021,663, filed Jan. 29, 2008, which claims priority to U.S. Provisional Application Ser. No. 60/887,116, filed Jan. 29, 2007, the contents of which is incorporated by reference herein in its entirety.

TECHNICAL FIELD OF THE INVENTION

The present invention relates to flexible electronic circuits.

BACKGROUND OF THE INVENTION

Flexible organic light-emitting diodes (OLEDs or organic LEDs) have been used as display elements on a display-wide sheet on a plastic. As the polymeric light-emitting diode (PLED) type of OLED uses a polymeric emissive electroluminescent layer, the light emitting material can be applied without a vacuum, such emissive materials can be applied by printing techniques. Such OLEDs have been printed in rows and columns on a plastic screen to create a color display, for television and cell phone screens. Organic thin-film transistors (TFTs) for such displays can also be printed on the display. Liquid crystal displays (LCDs) have also been used as display elements on a flexible display-wide substrate.

SUMMARY OF THE INVENTION

As described herein, the use of ribbons, with active devices such as thin-film transistors (TFTs) fabricated completely on individual ribbons, and assembly with connections between ribbons enables flexible electronic textiles to be inexpensive and practical for a wide for a variety of functions. This also allows testing of individual ribbons and their connections (including e.g. alignment) to other ribbons during assembly.

This is especially useful as different types of ribbons, e.g. ribbons containing inorganic active devices can be assembled with ribbons containing organic active devices, can be used in a textile. This allows different processes to be efficiently used for different components. One type of device (e.g. inorganic-TFT or SRAM) can be fabricated on one type of ribbon, and another type of device (e.g. organic-TFT, or LED) fabricated on another type of ribbon. Different color LEDs can also be fabricated on different ribbons. A number of ribbons can then be assembled in a manner where the different types of ribbons are electrically interconnected. In some embodiments, individual memory cells are fabricated on a ribbon. The use of ribbons provides flexibility and reduces costs. This is apparently the first time that ribbons containing devices such as thin-film transistors have been used in an electronic textile.

Making an electronic textile with ribbons provides a relatively large, relatively flat ribbon surface for creating electronic devices, such as TFTs and SRAMs, and for creating surface contacts on the surface of the ribbons (as opposed to a textile made from threads). Ribbons also provide orientation of rotation for ribbon-to-ribbon electrical contacting. Thus electronic devices and surface contacts can be created on a top surface of a warp ribbon and be easily orientated for electrical connection with electronic devices and surface contacts on a bottom surface of an overlying weft ribbon. This also allows fabrication processing all on one side of a ribbon, reducing costs.

TFTs may be used such that ribbons contain entire memory cells. By having entire memory cells on one ribbon, the number of interconnections at ribbon cross-over (e.g. where a warp ribbon crosses over, and has one or more electrical contact with, a weft ribbon) can be held to a reasonable number (e.g. two or three) of interconnections, while still retaining the advantages of ribbon fabrication.

In some embodiments, a number of entire memory cells on one ribbon (e.g. 5, 6, or 8) are connected together to give multiple (e.g. 5, 6, or 8) bits of digital memory. Thus 5 or 6 bits of memory could be stored for controlling the intensity of a sub-pixel on an adjacent (e.g. over-lying) ribbon in a display. A D-to-A (D/A) converter can be used to drive a transistor controlling current through an LED in an adjacent ribbon. One ribbon may be used to control a row of sub-pixels in a display and thus have, e.g. 16 bits per pixel and, e.g. 1024 pixels in a row, and thus over 16,000 memory cells on one ribbon.

During assembly of ribbon-containing electronic textiles, dynamic alignment of surface contacts and defect testing can be done by automated (and/or human) observation of light emission and/or electronic measurements (thus providing accurate alignment and/or allowing during-assembly replacement of ribbons containing defects). A weft ribbon being added and the warp ribbons can be energized through their longitudinal conductors and/or surface contacts to allow testing before the textile is completely assembled, thus significantly increasing production efficiency and yield.

Automated aligning of contacts is especially useful in centering of surface contacts, and preferably both the surface contacts of warp ribbons and surface contacts of the weft ribbons are centered (thus aligned in both x and y dimensions). Warp and weft ribbons may be pressed together to provide alignment-maintaining indentations in at least one of the warp and weft ribbons surface contacts after assembly or on a weft ribbon by weft ribbon basis during assembly.

With ribbons having surface contacts, dynamically aligning and testing can conveniently be done. With ribbons having light emitting devices and/or LCDs optical observation can be used for testing as well. The ease of removing and replacing a weft ribbon if the weft ribbon does not pass the test, allows convenient, during assembly repair, of ribbon-containing electronic textiles.

This may be a method of assembling an electronic textile, comprising: providing warp ribbons having surface contacts; energizing or grounding the warp ribbons; energizing or grounding a weft ribbon having surface contacts, and dynamically aligning surface contacts of the weft ribbon in electrical contact with surface contacts of the warp ribbons, wherein the aligning of the weft ribbon uses at least one of observation of light emission and electronic measurements; defect testing the weft ribbon using at least one of observation of light emission and electronic measurements; and removing the weft ribbon if the weft ribbon does not pass the test. The surface contacts allow testing before the textile is completely assembled, thus significantly increasing production efficiency and yield. Initial defect-free production is otherwise very difficult in large arrays of cells or pixels. Automated aligning of contacts is especially useful in centering of surface contacts, and preferably both the surface contacts of warp ribbons and surface contacts of the weft ribbons are centered (thus aligned in both x and y dimensions).

This can also be a method of assembling an electronic textile, comprising: assembling warp ribbons in parallel;

placing a first weft ribbon in electrical contact with the warp ribbons; and testing the first weft ribbon for at least one of electrical-contact alignment with the warp ribbons, and defects, using at least one of observation of light emission and electronic measurements. Preferably, weft ribbons are tested before the next weft ribbon is added. Preferably, if a weft ribbon is found defective, the weft ribbon is removed and replaced prior to adding the next weft ribbon. The weft ribbon may be tested after additional weft ribbons are added, and removed and replaced if the weft ribbon is found defective. The weft ribbon may be energized or grounded prior to being placed in contact with the warp ribbons. The energization of warp and/or weft ribbons may be with more than one voltage, and voltages may be pulsed, rather than steady, and may be signals, e.g. addressing signals. In some embodiments, the energizing and grounding may be at an end of one or more of the ribbons, e.g. by a socket.

In some embodiments, weft ribbons are fed from a spool, and may be cut from the spool before or after testing. The testing for alignment and/or defects, may be by automated observation of light emission and/or automated electronic measurements. The testing may also be by human observation of light emission and/or of electronic measurements.

Preferably, the warp ribbons are tested prior to being assembled or placed in the loom. This can also be a method of assembling a woven electronic textile in a loom, comprising: loading warp ribbons in the loom; energizing or grounding the warp ribbons; inserting a weft ribbon in the loom; energizing or grounding weft ribbon in the loom; and defect testing or alignment testing the weft ribbon using at least one of observation of light emission and electronic measurements.

If a weft ribbon is defect-free, warp and weft ribbons of a woven textile can be pressed together to provide alignment-maintaining indentations in at least one of the warp and weft ribbons. Again, automated aligning of contacts is especially useful in centering of surface contacts, and preferably both the surface contacts of warp ribbons and surface contacts of the weft ribbons are centered (thus aligned in both x and y dimensions). In some embodiments, if after all warp and weft ribbons are assembled (with surface contacts aligned) and are defect-free, all warp and weft ribbons are pressed together to provide alignment-maintaining indentations in at least one of the warp and weft ribbons. In some embodiments, if after all warp and weft ribbons are assembled and are defect-free, warp and weft ribbons of the textile are attached to a backing. Weft ribbons may also be pretested prior to being placed in contact with the warp ribbons.

As described herein, the use of ribbons containing inorganic thin-film transistors (TFTs) now enables flexible electronic textile displays to be inexpensive and practical for a wide variety of functions. Preferably one type of device (e.g. inorganic-TFT or inorganic-TFT-containing SRAM) is fabricated on one type of ribbon, and another type of device (e.g. organic-TFT, or LED) is fabricated on another type of ribbon. A number of ribbons can then be assembled in a manner where the different types of ribbons are electrically interconnected through surface contacts. Thus devices on one ribbon can be interconnected to devices on other ribbons to form a textile that is a functional unit.

This is especially useful as different types of ribbons, e.g. ribbons containing organic display-devices (e.g. LEDs) assembled with ribbons containing inorganic TFTs, can be used in combination, allowing different processes to be efficiently used for different components. The use of ribbons provides flexibility and reduces costs. Different color LEDs can also be fabricated on different ribbons. This is apparently the first time that inorganic TFT-containing ribbons have been used in an electronic textile display.

This can be a method of assembling an electronic display, comprising: providing ribbons containing display-devices; providing ribbons containing inorganic TFTs; and placing the display-device ribbons in electrical contact with the inorganic TFT ribbons to provide a textile display. Preferably, the inorganic TFTs are lithography fabricated.

Preferably, the inorganic TFTs are amorphous semiconductor transistors (however some or all of the inorganic TFTs may be polycrystalline). The TFTs may be parts of memory cells. The textile display that contains ribbons with organic display-devices, may contain other organic semiconductor devices (e.g. transistors). The organic containing ribbons are assembled into said electronic textile in direct or indirect electrical contact with the inorganic TFT ribbons. The organic display-device-containing ribbons can have devices such as LEDs, or LCDs, and may have organic transistors and/or other diodes. Entire inorganic TFTs (not just part of a TFT) are fabricated on a ribbon (not a thread, and not a large sheet of plastic) and are preferably lithography fabricated. The organic devices are also fabricated on a ribbon and can also be lithography fabricated. The display is formed by assembling a number of ribbons in a manner where the ribbons are electrically interconnected.

This can also be a method of assembling an electronic textile display comprising: providing ribbons containing organic LEDs or LCD devices; providing ribbons containing lithography fabricated inorganic TFTs; and placing the LEDs or LCD device containing ribbons in electrical contact with the inorganic TFT ribbons to provide a textile display. Preferably, the ribbons containing inorganic TFTs contain memory circuitry.

This may also be a method of assembling a woven electronic textile; comprising: providing ribbons containing organic display-devices; providing ribbons containing inorganic TFTs; and weaving the organic display-device ribbons in direct or indirect electrical contact with the inorganic TFT ribbon to provide a woven electronic textile. In other embodiments, some or all of the ribbons are not woven, but are attached to a textile backing.

This can also be an electronic display element, comprising: a ribbon containing an organic display-device; and a ribbon with an inorganic TFT, wherein and the organic display-device ribbon is in electrical contact with the inorganic TFT ribbon to provide a textile display element. The display element (e.g. sub-pixel) may have a lithography fabricated inorganic TFT, and may be part of a textile display.

The textile can contain organic display-device ribbons in direct or indirect electrical contact with TFT ribbons through surface contacts. The organic-display-device containing ribbons can contain devices such as organic LEDs or LCDs and also have organic transistors. In one embodiment, organic-display-device-containing ribbons also contain organic transistors to control current to organic LEDs or control voltages to LCDs, with the organic transistors receiving signals from memory cells on ribbons with the inorganic memory cells (this reduces current through surface contacts, and in some cases the signals may be capacitively or inductively coupled). The memory cells may be static or dynamic.

The use of circuits with a combination of ribbons containing inorganic TFTs and ribbons containing display-devices now enables flexible electronic display textiles to be inexpensive and practical for a wide for a variety of functions. Using ribbons provides a larger, flatter surface (than, e.g. threads) for creating electronic devices, such as TFTs or SRAMs, and for creating surface contacts on the surface of the ribbons, but avoids the yield problems that putting an entire display on one substrate entails, especially on large displays.

As described herein, the use of ribbons containing organic TFTs now enables flexible electronic textile displays to be inexpensive and practical for a wide for a variety of functions. This is especially useful as different types of ribbons, e.g. ribbons containing organic display-devices (e.g. LEDs) assembled with ribbons containing organic TFTs, can be used in combination, allowing different processes to be efficiently used for different ribbons. Different color LEDs can also be fabricated on different ribbons. This is apparently the first time that organic TFT-containing ribbons have been used in an electronic textile display.

This can also be a method of assembling an electronic display, comprising: providing ribbons containing display-devices; providing ribbons containing organic TFTs; and placing the display-device ribbons in electrical contact with the organic TFT ribbons to provide a textile display. Preferably, the organic TFTs are lithography fabricated. In some embodiments, the organic TFTs are part of memory cells. The display devices are also fabricated on a ribbon and can also be lithography fabricated.

The textile can contain organic display-device ribbons in direct or indirect electrical contact with TFT ribbons through surface contacts. The organic-display-device containing ribbons can contain devices such as organic LEDs or LCDs and also have organic transistors. In one embodiment, organic-display-device-containing ribbons also contain organic transistors to control current to organic LEDs or control voltages to LCDs, with the organic transistors receiving signals from memory cells on a different ribbon (this reduces current through surface contacts, and in some cases the signals may be capacitively coupled). The ribbon with the memory cells may have organic or inorganic memory cells. The memory cells may be static or dynamic.

They may also contain organic or inorganic passive devices, and in some embodiments might even contain inorganic TFT devices. Organic display-device containing ribbons with transistors can be woven with ribbons having organic TFTs, with the organic TFTs being part of memory cells in display applications. In some applications the memory cells (and/or other circuitry) may have both PMOS and NMOS transistors, with the NMOS transistors being inorganic and the PMOS transistors being organic.

In some preferred embodiments, the organic display-device containing ribbons contain LEDs, and the organic TFT containing ribbons contain memory cells. The ribbons may be woven in the textile or be used in conjunction with (e.g. attached to) a woven backing. The textile may provide red, green and blue light (preferably, separate ribbons are used for the red, green and blue light). In some embodiments, intensity of light generated in the textile is digitally controlled. The textile may provide visible light, and/or UV light and/or IR light.

The organic TFTs may be part of a RAM cell. The use of static RAM pixel drive circuits, such as SRAMs allows asynchronous addressing and the addressing of individual pixels only when that pixel changes, rather than addressing every pixel 60 to 80 times a second as with dynamic RAM pixel drive circuits, dramatically reducing power and bandwidth requirements (see "Display Bandwidth Reduction via Latched Pixels and Processing at the Pixel" by B. Gnade, et al,; Cockpit Displays IX: Displays For Defense Applications, Darrel G. Hopper, Editor, Proceedings Of SPIE Vol. 4712 (2002) Copyright 2002 SPIE 0277-786X/02, which is hereby incorporated by reference herein.)

The textile may provide at least part of a radio, music player, or transceiver that includes a display. If the textile contains inorganic transistors they are preferably amorphous, and principally comprise silicon, germanium, zinc oxide, zinc-tin oxide, or a combination thereof. III-VI diodes and transistors may also be used. The textile can also contain passive devices such as capacitors and resistors on either type of ribbon. The textile can also contain memory cells for other purposes such as computing, display (including asynchronous) or a music player.

In some embodiments, the textile is used in an article of clothing, and may be waterproof. The textile may be used in conjunction with a computer (circuitry and/or monitor), or in a television, e.g. as a large TV display.

This may also be a method of assembling a woven electronic textile; comprising: providing ribbons containing organic display-devices; providing ribbons containing organic TFTs; and weaving the organic display-device ribbons in direct or indirect electrical contact with the organic TFT ribbon to provide a woven electronic textile. In other embodiments, some or all of the ribbons are not woven, but are attached to a textile backing.

This can also be an electronic display element, comprising: a ribbon containing an organic display-device; and a ribbon with an organic TFT containing RAM, wherein and the organic display-device ribbon is in electrical contact with the organic TFT ribbon to provide a textile display element. Preferably the organic TFT is lithography fabricated. In many embodiments, the electronic display element is part of a textile display.

The use of circuits with a combination of ribbons containing organic TFTs and ribbons containing organic display-devices now enables flexible electronic display textiles to be inexpensive and practical for a wide for a variety of functions. Using ribbons provides a larger, flatter surface (than, e.g. threads) for creating electronic devices, such as SRAMs, and for creating surface contacts on the surface of the ribbons.

Herein, ribbons containing devices can be assembled in electrical contact with ribbons containing other devices (preferably organic) to enable flexible electronic textile circuits to be inexpensive and practical for a wide for a variety of functions. The use of ribbons provides flexibility, reduces costs, and allows different processes to be efficiently used for different components. While flexible electronic circuits on single display-wide sheet of plastic have been used for functions including for television and cell phones, this is apparently the first time that ribbons (especially organic-device-containing ribbons) have been interconnected to form a flexible electronic textile.

The textile may be waterproof and in some embodiments may be used in an article of clothing. In some embodiments, the memory cells are woven into the textile, and in other embodiments the memory cells attached to a backing, and in still other embodiments, the memory cells are partially woven into the textile and partially attached (e.g. sewn) to a backing. A textile of random access memory cells may be used to control LEDs. The textile may be used in conjunction with a computer (circuitry and/or monitor), or in a television, e.g. as a large TV display. The transistors are preferably entirely fabricated on a single ribbon, and are preferably lithography fabricated.

In some embodiments, the electronic textile has inert ribbons and/or threads with no conductors or surface contacts, e.g., as spacers, or to aid in keeping ribbons aligned. In some embodiments, the electronic textile also has ribbons and/or threads with conductors and surface contacts, but without active devices, for interconnecting memory-cell ribbons. In some embodiments, the electronic textile contains ribbons with passive devices such as capacitors or resistors. In some embodiments, the electronic textile contains other functional devices such as a batteries, light sensors, and/or energy collectors (e.g. solar cells or rf collectors).

The ribbons may be woven in the textile or be used in conjunction with (e.g. attached to) a woven backing The textile may provide red, green and blue light. In some embodiments, intensity of light generated in the textile is digitally controlled. The textile may provide visible light, and/or UV light and/or IR light. The use of static RAM pixel drive circuits, such as SRAMs or FRAMs allows asynchronous addressing and the addressing of individual pixels only when that pixel changes, rather than addressing every pixel 60 to 80 times a second as with dynamic RAM pixel drive circuits, dramatically reducing power and bandwidth requirements (see "Display Bandwidth Reduction via Latched Pixels and Processing at the Pixel" by B. Gnade, et al,; Cockpit Displays IX: Displays For Defense Applications, Darrel G. Hopper, Editor, Proceedings Of SPIE Vol. 4712 (2002) Copyright 2002 SPIE 0277-786X/02, which is hereby incorporated by reference herein.)

The use of textiles with ribbons now enables flexible electronic textiles to be practical and allows the combination of ribbons fabricated using different types of processing. Using ribbons provides a larger, flatter surface (than, e.g. threads) for creating electronic devices, such as transistors and for creating surface contacts on the surface of the ribbons.

BRIEF DESCRIPTION OF THE DRAWINGS

The above and further advantages of the invention may be better understood by referring to the following description in conjunction with the accompanying drawings (which use an analog RAM for simplicity), in which.

DETAILED DESCRIPTION OF THE INVENTION

Figure 1:
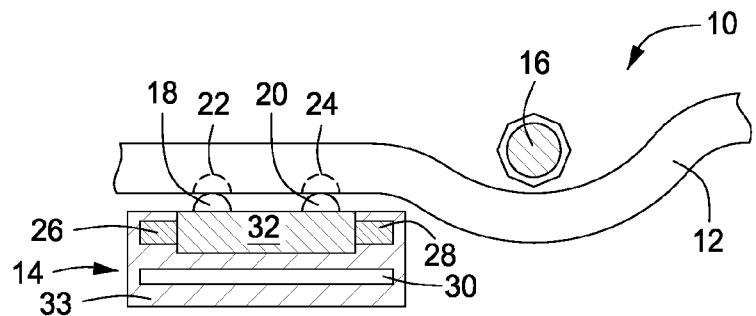
FIG. 1 shows a portion of an electronic textile (part of a display in this example) with side view of a segment of an LED (e.g. an OLED)-containing ribbon with a sub-pixel (e.g. red) LED, woven with a RAM-containing ribbon (shown in cross-section), and an inert thread (shown in cross-section), with the bottom of the LED-containing ribbon being in electrical contact with the top of the RAM-containing ribbon.

Devices can be manufactured on a ribbon, preferably by thin-film fabrication techniques. Flat surfaces on ribbons can allow most semiconductor manufacturing techniques to be used. Multilayer depositions can be used and devices on the ribbon can be sealed and can be encapsulated. Devices can be patterned by lithographic techniques. Vacuum deposition of materials through metal shadow masks, and screen printing can also be used. Reel to reel techniques can be used in manufacturing (including in-vacuum manufacturing). Ribbons may be very long, e.g. hundreds or thousands of feet), and then cut to the desired length. Ribbons can be quite wide (e.g. a foot or more) or may be relatively narrow, e.g. 1/32 of an inch, or less, for moderately large (e.g. 8 foot wide) displays. Connectors can be placed on some or all ends of the ribbons. Multiple ribbons can also be connected to one connector.

Ribbons can contain addressing circuitry, e.g. on one or more sides of a display or memory, to minimize the number of connections to the textile. Connectors can be used for incoming signals and/or incoming power. Outgoing connections can be used to connect to external devices, such as earphones or headsets, or to an item to be charged, e.g. cell phones, or MP3 Players.

Using known semiconductor fabrication techniques, all the materials for flexible thin-film transistors (including insulators and encapsulates) can be deposited in flexible form on ribbon substrates, and can be wired into circuits and to contacts on the ribbon surface. Using known semiconductor fabrication techniques, all the materials for battery cells, light sensors, antennas, and solar cells can also be deposited in thin-film flexible form on ribbon substrates, and can be wired into circuits and to contacts on the ribbon surface. Using semiconductor fabrication techniques, battery cells, light sensors, antennas, and solar cells can all be fabricated in very narrow areas (e.g. 1 mm by 3 mm, or 1 mm by 100 mm) and thus can be fabricated on relatively narrow ribbons. In many embodiments, the ribbons herein are preferably between 0.5 mm and 1 cm, but in some applications, e.g. very large displays, sub-pixels (and their ribbons) may be 10 cm or more, and may use, e.g. screen printing, rather than lithography. Thin-film batteries are described for example, in U.S. Pat. No. 7,056,620, "Thin film battery and method of manufacture" to Krasnov et al, and U.S. Pat. No. 6,962,613 "Low-temperature fabrication of thin-film energy-storage devices" to Jenson (which notes a flexible substrate). As used herein, the term "containing" as regards to devices and TFTs and such means devices fabricated on the surface of or within a ribbon and internally electrically connected within the ribbon, e.g. to ribbon longitudinal conductors, to other devices contained within the ribbon and/or to surface contacts. Devices fabricated on the surface may be deposited by semiconductor processes, lithographically patterned, deposited through masks, printed (including screen printed), etc.

Interconnecting ribbons can also be used to make connections between various areas of the textile that have different functions. For example, solar cells might be in one area, and battery cells in another area and be connected by interconnecting ribbons. A battery charge control circuit could be located between the two. A radio transceiver might be connected by interconnecting ribbons to an antenna and have a connector for a headset. Line-of-sight communication systems might use light sensors and LEDs (preferably narrow band) for receiving and sending signals. A cyclist's vest could flash a strobe signal when activated by a car's headlights. Such applications could be largely devices on ribbons, integrated in a textile with interconnecting ribbons.

The ribbons may be woven together much the same as a basket weave, however, the weave may vary with a ribbon going over two or more ribbons before going under a ribbon again. Fastening ribbons on a fabric backing (by, e.g. sewing) can provide even more flexibility, as, e.g., one type of ribbon could be on top most or even all of the time.

The ribbon textile can contain memory circuitry and longitudinal conductors for addressing the memory circuitry (e.g. bitlines in the warp ribbons and word-lines in the weft ribbons).

During assembly of ribbon-containing electronic textiles, dynamic alignment of surface contacts and defect testing can be done by automated (and/or human) observation of light emission and/or electronic measurements (thus providing accurate alignment and allowing during assembly replacement of ribbons containing defects). Warp ribbons and a weft ribbon being added can be energized through their longitudinal conductors and/or surface contacts to allow testing before the textile is completely assembled, thus significantly increasing production efficiency and yield. Automated aligning of contacts is especially useful in centering of surface contacts, and preferably both the surface contacts of warp ribbons and surface contacts of the weft ribbons are centered (thus aligned in both x and y dimensions). Warp and weft ribbons may be pressed together to provide alignment-maintaining indentations in at least one of the warp and weft ribbon surface contacts after assembly, or on a weft ribbon by weft ribbon basis during assembly.

In some embodiments, surface contacts are along outside edges (rather than near the center) of the ribbons, e.g., such that a surface contact on a bottom surface edge of a top ribbon could make an electrical connection with a surface contact on a top surface edge of a bottom ribbon. Having surface contacts on the edge of ribbons can more easily be away from devices on the ribbon, such that deformations at the contacts is further from the devices, and can make it easier to have pressure keeping the contacts together. Such surface contacts can be relatively long in the longitudinal direction of the ribbon and relatively thin in a transverse direction.

This method can use assembling warp ribbons in parallel, energizing or grounding the warp ribbons, placing a weft ribbon substantially perpendicular to and in contact with the warp ribbons, and energizing or grounding the weft ribbon; and testing the weft ribbon for electrical-contact alignment with the warp ribbons and/or for defects using at least one of observation of light emission and electronic measurements. Testing of the ribbons, of course, can also be done prior to being assembled or placed in the loom. Ribbons can have connectors on one end and as such can be tested between their end connectors and their surface contacts.

Preferably, weft ribbons are tested before the next weft ribbon is added. Preferably, if a weft ribbon is found defective, the weft ribbon is removed and replaced prior to adding the next weft ribbon. The weft ribbon may also be tested after additional weft ribbons are added, or even after normal assembly has be completed, and removed and replaced if the weft ribbon is found defective. This is more expensive, but can be done in some cases, if necessary. The weft ribbon may be energized or grounded prior to being placed in contact with the warp ribbons.

With ribbons having surface contacts, dynamically aligning and testing can conveniently be done. With ribbon having light emitting devices and/or LCDs optical observation can be used for testing as well. The ease of removing and replacing a weft ribbon if the weft ribbon does not pass the test, allows convenient, during assembly repair, of ribbon-containing electronic textiles.

In some embodiments, weft ribbons are fed from a spool, and may be cut from the spool before or after testing. The testing for alignment and/or defects, may be by automated observation of light emission and/or automated electronic measurements. The testing may also be by human observation of light emission and/or of electronic measurements. Alignment testing can use longitudinal movement back and forth to determine surface contact ends and then center the ribbon between the surface contact ends in one dimension. Alignment testing can use movement side to side (and/or at angles) to similarly center the ribbon laterally.

If a weft ribbon is defect-free, warp and weft ribbons of woven textile can be pressed together to provide alignment-maintaining indentations in at least one of the warp and weft ribbons. Again, automated aligning of contacts is especially useful in centering of surface contacts, and preferably both the surface contacts of warp ribbons and surface contacts of the weft ribbons are centered (thus aligned in both x and y dimensions). In some embodiments, if after all warp and weft ribbons assembled (with surface contacts aligned) and are defect-free, all warp and weft ribbons are pressed together to provide alignment-maintaining indentations in the warp and/or weft ribbons. In some embodiments, if after all warp and weft ribbons assembled and are defect-free, warp and weft ribbons of the textile are attached to a backing.

The assembling of a woven electronic textile can be done with a loom, as a loom can easily apply controlled pressure between surface contacts during testing, and can be "backed up" for easy removal of a weft ribbon. However, even if a loom is not used or the textile is not woven, our lab experiments have shown this type of testing and alignment to be effective. Further, the use with ribbons of the terms "warp" as used herein means ribbons substantially in parallel in a first direction and "weft" as used herein means ribbons substantially perpendicular to that first direction, whether or not the ribbons are in a loom.

The circuits described herein use ribbons in electrical contact with other ribbons. The display is formed by assembling a number of ribbons in a manner where the ribbons are electrically interconnected, and thus devices on one ribbon are interconnected to devices on other ribbons to form a textile that is a functional unit. Further, entire inorganic SRAMS may also be fabricated on a ribbon.

The use of electronic displays assembled using ribbons containing inorganic devices (e.g. TFTs) electrically interconnected with ribbons containing organic devices (e.g. LEDs) now enables flexible electronic textile displays to be inexpensive and practical for a wide variety of functions. Further, entire inorganic SRAMS may also be fabricated on a ribbon. Our combination of ribbons to form an electronic textile display uses inorganic TFT-containing ribbons (TFTRs). The TFTRs in combination with organic display-device containing ribbons (ODRs) can be woven.

One embodiment has an electronic textile as part of a display with organic-LED (OLED)-containing ribbons with sub-pixel (e.g. red, green, or blue) LEDs, woven with inorganic-RAM-containing ribbons, and inert thread, with the bottom of the organic-LED-containing ribbon being in electrical contact with the top of the RAM-containing ribbon. The RAM-containing ribbons can be run parallel to or perpendicular (or both) the organic-LED-containing ribbons. Analog RAMs are used in this example for simplicity, other types of drive circuits, e.g. SRAMs could also be used. When run parallel to the organic-LED-containing ribbons, electrical contacts can be made indirectly by interconnect ribbons or interconnect threads.

Unlike the electronic circuits on a single display-wide flexible sheets of plastic, e.g. for television and cell phone displays, the circuits described herein use ribbons in electrical contact with other ribbons. Our combination of ribbons to form an electronic textile display can use organic TFT-containing ribbons (TFTRs) woven with organic display-device containing ribbons (ODRs).

Entire organic TFTs (not just parts of a TFT) are preferably fabricated on a ribbon (not a thread, and not a large sheet of plastic) and are preferably lithography fabricated. Further, entire inorganic SRAMS may also be fabricated on a ribbon. Organic devices (e.g. entire LEDs) are also fabricated on a ribbon and can also be lithography fabricated.

This can also be a method of assembling an electronic textile, using ODRs; providing ribbons containing at least one of organic semiconductor transistors and organic semiconductor diodes; and placing the ODRs in direct or indirect electrical contact with the organic semiconductor containing ribbons to provide an electronic textile.

To our knowledge there are no previous examples of textile displays based on organic light emitting materials. One of the keys to successfully making a textile display based on organic light emitting materials is the ability to make ribbons that are robust and can be incorporated into the textile display with high yield and high reliability.

To our knowledge, all other solutions for flexible displays based on OLEDs are based on implementations using a single substrate for the display. Here, the OLED/PLED picture elements are formed on a ribbon and the display is assembled from the ribbons. Here the process used to fabricate an OLED/PLED stack can be optimized specifically for that structure. For instance, in our embodiment, not all of the colors need to be on one OLED ribbon. We can mix and match materials and processes to give the best performance for that specific color, because each of the colors can be made on a separate substrate (e.g. all of the blue-emitter ribbons being made with a different process, than the red-emitting ribbons). The different substrates are brought together once the ribbons are in the display format (e.g. woven). This also makes it much easier to make a color display using OLEDs, because one can eliminate the need to pattern the different color materials.

Another significant difference is that each ribbon of the pixel elements can be pretested, and/or can be tested (and replaced if necessary) during assembly. In a traditional display if there are more than a few defects, either in the active matrix control logic, or in the picture elements, the entire display is scrapped. In our embodiment, only a single strip (e.g. one weft ribbon the width of the display) would have to be scrapped, of either the picture element or control logic element. The other significant advantage is that this technique should allow us to make very large displays, because the essentially defect free area need only be the width of a single ribbon times the length of the ribbon, rather than the width of the entire display times the length of the entire display.

Similarly, different organic devices can be made on different ribbons. For example, logic circuit ribbons and RAM ribbons can be made by different processes and then combined into an electronic textile. Further, organic PMOS devices and inorganic NMOS devices can be made by different processes and then combined into an electronic textile.

The textile can contain organic display-devices ribbons in direct or indirect electrical contact with TFTs ribbons through surface contacts. The organic-display-device containing ribbons can contain devices such as organic LEDs or LCDs and also have organic transistors. In one embodiment, organic-display-device-containing ribbons also contain organic transistors to control current to organic LEDs or control voltage to LCDs, with the organic transistors receiving signals from memory cells on different ribbons (this reduces current through surface contacts, and in some cases the signals may be capacitively or inductively coupled). The ribbon with the memory cells may have organic or inorganic memory cells. The memory cells may be static or dynamic. As used herein the terms "electrical contact" and "ribbon-to-ribbon electrical contacting" and "electrically interconnected" and "electrically connected" and "electrical connection" include being placed in position to be capacitively or inductive coupled. Further, measurements for defect testing and alignment may include capacitive or inductive coupling measurements.

In some embodiments, the textile contains encryption circuitry and/or de-encryption circuitry. In some embodiments, the textile is part of a two-way radio (with encrypted conversations or text messages). A microphone and/or a speaker may be part of the textile, or separate (e.g. a headphone). In some embodiments, the textile is used in an article of clothing, such as a vest, a shirt, or hat, but the textile could be in other items, such as an umbrella.

The ribbons with one type of device can be substantially parallel to, substantially perpendicular to or even be at some other angle to other similar ribbons. Preferably ribbon-to-ribbon surface contacts are on the top of ribbons running parallel in a first direction and on the bottom of ribbons running perpendicular to the first direction. Preferably devices are also on the top surface of ribbons running parallel in the first direction and on the bottom of ribbons running perpendicular to the first direction.

Unlike the electronic display circuits on display-wide flexible sheets of plastic as used, e.g. for television and cell phone displays, circuits described herein, use ribbons in electrical contact with other ribbons. Memory cells may be as simple as one transistor—one capacitor cells. Flexible past displays have apparently not used static memory cells. Our memory cells are preferably static memory cells, rather than dynamic. A combination of ribbons to form an electronic textile can use inorganic memory-cell containing ribbons and/or organic memory-cell containing ribbons. The cells may be analog or digital. The ribbons preferably contain digital, static cells, such as SRAMs. The ribbons may contain analog or digital FRAM cells.

Preferably, inorganic transistors are non-single crystal, and principally comprise silicon, germanium, zinc oxide, zinc-tin oxide, or a combination thereof. Preferably, the inorganic transistors and/or diodes are amorphous (but they may be polycrystalline). III-VI diodes and transistors may also be used.

The memory circuitry may include one or more fusible link which may be used to introduce serial numbers into a textile, or for programming or for repairing textile circuitry. Fusible link memory circuitry is described in U.S. Pat. No. 5,412,593 "Fuse and antifuse reprogrammable link for integrated circuits" to Magel and Stoltz, which is hereby incorporated by reference herein. A fuse and antifuse link structure, which when used with a memory integrated circuit device such as a gate array or programmable read-only memory (PROM), allows the memory circuit to be reprogrammed. The fuse and antifuse link is comprised of a fuse and an antifuse, connected in series, parallel, or a combination thereof. Either element of the link can be programmed initially, and the other can be programmed in a second step, to reverse the first programming. Several links can be used in one circuit to provide multiple reprogramming capability.

The textile can also contain passive devices such as capacitors and resistors. The capacitors may have a hafnium silicate dielectric, which is preferred as its high dielectric constant allows size reduction.

Entire transistors (not just parts of a transistor) are fabricated on a ribbon (not a thread, and not a memory-wide or display-wide of plastic) and are preferably lithography fabricated. Organic devices (e.g. entire LEDs) can also be fabricated on a ribbon and can also be lithography fabricated. The memory may be formed by assembling a number of ribbons in a manner where the ribbons are electrically interconnected, and such that devices on one ribbon are interconnected to devices on other ribbons to form a memory that is a functional unit. While an entire SRAM may also be fabricated on a ribbon, organic transistors, e.g. PMOS may be on one ribbon and inorganic transistors, e.g. NMOS may be on another (e.g. perpendicular) ribbon. Organic LEDs and inorganic transistors may be similarly on perpendicular ribbons.

Inorganic devices can be deposited on an organic substrate, or can use metal foil ribbons or wires if for example, components are needed that require high temperature processing. High temperature processing can be done on metal foil followed by lower temperature processing that adds other parts, such as insulating plastic. Some people have experimented with organic thin film transistors (OTFTs) on thread, but not on ribbon. Others have suggested active regions on ribbons, but not an entire transistor, let alone an entire memory cell, see Ebbesen, below). Our use of ribbons maintains orientation during fabrication and enables the use of integrated circuit production techniques in the manufacture of circuits (rather than just devices) and allows, e.g. circuits on the top of a ribbon and conductors (voltage bus, ground, addressing line, etc.) on the back side. The IDRs may also contain organic active devices, e.g. transistors. Thin-film transistors (TFTs), and processes for making both organic and inorganic are well known. Patents for TFTs for use in displays include U.S. Pat. No. 6,952,021 "Thin-film transistor and method for making the same" by Tanaka, et al. with an inorganic transistor, and U.S. Pat. No. 6,784,452 "Organic thin film transistor" by Toguchi, et al.

The textile may contain ribbons containing active inorganic semiconductor and ribbons containing active organic semiconductor, (e.g. a polymer or a molecular device) devices. The memory-cell ribbons may have surface contacts in direct or indirect electrical contact with the surface contacts of other ribbons of other types. The active organic device containing ribbons can be LEDs, LCDs, transistors or other devices. There are a variety of types of LCDs, including ferroelectric and polymer. As used herein the term "organic display devices" is used to include all types of LCDs. The active organic devices may include inorganic dielectrics and passive elements, either organic, inorganic, or both. Unlike LCD displays, OLEDs do not require a backlight and thus generally use less energy, and can be less costly to fabricate than the traditional LCD displays.

The ribbon-to-ribbon electrical connections may be direct or indirect, (e.g. ribbons may be connected through other ribbons, or threads, or wires) and such connections are preferably made through surface contacts. Generally, the devices on the ribbons are directly or indirectly electrically connected to the ribbon's surface contacts (they may be directly connected by one or more conductor, or there may be intervening devices). Further, devices on the ribbons may be directly or indirectly electrically connected to a ribbon's longitudinal conductor, e.g. voltage bus, ground bus, and/or cell or sub-pixel addressing line (wordline or bitline).

The use of ribbons provides flexibility, reduces costs, and allows different processes to be efficiently used for different components (e.g. in both LED and LCD applications). This is apparently the first time that inorganic device containing ribbons have been used in an electronic textile. Ebbesen U.S. Pat. No. 6,856,715 weaves various elements, including ribbons to construct devices such as transistors from active regions on multiple substrates "to provide a lithography-free process" rather than fabricating transistors entirely on a single ribbon. Our devices (e.g. transistors or RAMs) are fabricated entirely on a single ribbon and are preferably lithography fabricated.

In most embodiments, the transistors are TFTs, e.g. in SRAMs. FRAMs (ferroelectric RAMs) may have ferroelectric-TFTs and/or ferroelectric capacitors. The FRAMs may be analog or digital. The ribbons may be woven in the textile and/or be used in conjunction with (generally attached to) a woven backing The textile may provide red, green and blue light, and again, different color LEDs can also be fabricated on different ribbons. In some embodiments, intensity of light generated in the textile is digitally controlled. The textile may provide UV light and/or IR light. Preferably, the textile contains inorganic transistors that are amorphous, and principally comprise silicon, germanium, zinc oxide, zinc-tin oxide, or a combination thereof.

The use of static RAM pixel drive circuits, such as SRAMs or FRAMs allows asynchronous addressing and the addressing of individual pixels only when that pixel changes, rather than addressing every pixel 60 to 80 times a second as with dynamic RAM pixel drive circuits, dramatically reduces power and bandwidth requirements (see "Display Bandwidth Reduction via Latched Pixels and Processing at the Pixel" by B. Gnade, et al, noted above). This can provide bandwidth reductions similar to those provided by the use of JPEG.

The use of circuits with a combination of ribbons containing inorganic active devices (and especially a combination of different types of ribbons) now enables flexible electronic textiles to be inexpensive and practical for a wide for a variety of functions. Using ribbons provides a larger, flatter surface (than, e.g. threads) for creating electronic devices, such as SRAMs, and for surface contacts (such that sliding contacts can be used for greater textile flexibility).

In one of our test embodiments, a display was assembled with ribbons containing organic active devices (OLEDs). Such ribbons can be woven with ribbons containing inorganic drive transistors.

To our knowledge there are no previous examples of ribbon displays based on organic light emitting materials. One of the keys to successfully making a textile display based on organic light emitting materials is the ability to make ribbons that are robust and can be incorporated into the woven display with high yield and high reliability.

The process for making the OLED/PLED element can start with a transparent, plastic substrate (as used herein, the term "OLED/PLED" generally means "an OLED, preferably, a PLED"). In this particular example the substrate is designated as PEN (Poly Ethylene Naphthalate) or PET (poly(ethylene terephthalate). On one side of the plastic there was a transparent conductor, which made up the anode. The anode was indium tin oxide (ITO), but could be any transparent conductor that has low resistivity and high transparency in the region of interest. The ITO was patterned to limit the area of overlap between the anode and the top metal contact. This reduces the probability of having an electrical short through the insulator between the anode and cathode. The next step in the process was deposition of a dielectric, as an electrical insulator to separate the anode and cathode everywhere except through the OLED stack. The insulator can also provide a physical barrier to restrict the permeation of oxygen and water into the OLED/PLED stack from the side. Examples of materials which could be used as the insulator include oxides such as Al2O3 or SiO2, nitrides such as Si3N4, or an organic dielectric such as parylene. In many embodiments, the dielectric is preferably an inorganic material, to provide better physical barrier properties. The next step is to form the OLED/PLED stack. The light emitting stack can be as simple as a one layer polymer such as MEH-PPV (poly[2-methoxy-5-(2'-ethyl-hexyloxy)-p-phenylene vinylene]), or it can be more complicated, such as an electron injection layer—hole blocking layer—emissive layer—electron blocking layer—role injection layer. The complexity of the layer structure is determined by the light emitting material used. After the OLED/PLED structure was formed, the cathode was deposited. In this example the cathode was a layered structure of LiF/Al, but could be Al only, AgMg, Ca/Al, etc., again dependent on the OLED/PLED stack material used. A noble metal layer can be added on top of the cathode to improve the contact between the row and column ribbons. This top layer of noble metal can also serve the added function of providing a barrier to oxygen and moisture from reaching the cathode material or the OLED/PLED material. In addition the noble metal layer can extend beyond the area of the pixel element. Finally an insulating barrier layer was added on top of the completed stack to further reduce the permeation of oxygen and water.

One of our test embodiments demonstrated the use of processing using organic active devices, in this case diodes. The processing of organic transistors is similar.

Similarly, different inorganic devices can be made on different ribbons. For example, logic circuit ribbons and FRAM ribbons can be made by different processes and then combined into an electronic textile. Further, organic PMOS devices and inorganic NMOS devices can be made by different processes and then combined into an electronic textile. FRAM circuits with OLEDs are mentioned is U.S. Pat. No. 6,972,526 by Abe; U.S. Pat. No. 6,563,480 by Nakamura; and U.S. Pat. No. 6,872,969 by Redecker. FRAM circuits with liquid crystal displays (LCDs) are mentioned is U.S. Pat. No. 6,819,310 by Huang, et al.; U.S. Pat. No. 6,747,623 by Koyama; U.S. Pat. No. 6,850,217 by Huang, et al.; and U.S. Pat. No. 6,563,483 by Sakumoto. Sakumoto '483 also mentions asynchronous addressing of pixels.

To our knowledge, all other solutions for flexible displays based on OLEDs are based on implementations using a single substrate for the display. Here, the OLED/PLED picture elements are formed on a ribbon and the display is assembled from the ribbons. Here the process used to fabricate an OLED/PLED stack can be optimized specifically for that structure. For instance, in our embodiment, not all of the colors need to be on one OLED ribbon. We can mix and match materials and processes to give the best performance for that specific color, because each of the colors can be made on a separate substrate (e.g. all of the blue-emitter ribbons being made with a different process than the red-emitting ribbons). The different substrates are brought together once the ribbons are in the display format (e.g. woven). This also makes it much easier to make a color display using OLEDs, because it eliminates the need to pattern the different color materials. Another significant difference is that each ribbon of the pixel elements can be pretested, and/or can be tested (and replaced if necessary) during assembly. In a traditional display if there are more than a few defects, either in the active matrix control logic, or in the picture elements, the entire display is scrapped. In our embodiment, only a single strip (e.g. one weft ribbon the width of the display) would have to be scrapped, of either the picture element or control logic element. The other significant advantage is that this technique should allow us to make very large displays, because the essentially defect free area need only the width of a single ribbon times the length of the ribbon, rather than the width of the entire display times the length of the entire display.

Similarly, different inorganic devices can be made on different ribbons. For example, logic circuit ribbons (or LED ribbons) and FRAM ribbons can be made by different processes and then combined into an electronic textile. Further, organic PMOS devices and inorganic NMOS devices can be made by different processes and then combined into an electronic textile.

The electronic textile ribbons may be woven, may be attached onto a fabric backing, or a combination thereof (e.g. some ribbons may be woven, others not woven, with both woven and not-woven ribbons attached onto a fabric backing) Further, other components such as threads or wires can be used in the electronic textile, and said other components can be woven with the ribbons (or not), and can also be used in attaching of ribbons onto a fabric backing.

During assembly, in some embodiments, dynamic alignment of surface contacts and defect testing can be done by automated (and/or human) observation of light emission and/or electronic measurements (allowing during assembly replacement of ribbons containing defects). Warp ribbons and a weft ribbon being added can be energized through their longitudinal conductors and surface contacts to allow testing before the textile is completely assembled, thus significantly increasing production efficiency and yield. Automated aligning of contacts is especially useful in centering of surface contacts, and preferably both the surface contacts of warp ribbons and surface contacts of the weft ribbons are centered (thus aligned in both x and y dimensions). Warp and weft ribbons may be pressed together to provide alignment-maintaining indentations in the warp and/or weft ribbons surface contacts after assembly or on a weft ribbon by weft ribbon basis during assembly.

Indentations may be facilitated by having deformable plastic or elastomeric under a metal contact. In some cases, using a plastic (e.g. thermoplastic or thermosetting, or thermoplastic elastomer) under a metal contact and heat during deformation can be used. In some embodiments, metal to metal bonding is used between surface contacts in the assembled fabric. In some preferred embodiments, metal to metal contact without bonding is used between surface contacts in the assembled fabric. In other cases, metal to conductive organic to metal is used.

The ability to make defect free systems using conventional processing technology over a square meter has been a daunting technical challenge. The concept of a textile display that is fabricated a ribbon at a time can address several issues; 1) each ribbon can be pre-tested, so the area that must be defect free is only the width of the system times the width of an individual ribbon, 2) the cost of manufacturing the system will increase linearly with area for a textile, rather than quadratically for a single substrate system, 3) complexity at the element level can be increased because each ribbon can contain several active components, and 4) overall complexity is provided at the system level, by integrating simple device ribbons together. Because we can use the textile display architecture, we are no longer constrained to using the same process flow for the different pixel elements. We can use the best process for each, so when they are combined we get the best system solution. The OLED/PLED pixel architecture described herein provides a robust pixel that can be less sensitive to oxygen and water, and that can provide good electrical isolation between the anode and cathode over the entire length of the pixel element ribbon.

One embodiment has an electronic textile as part of a display with organic-LED (OLED)-containing ribbons with sub-pixel (e.g. red, green, or blue) LEDs, woven with inorganic-RAM-containing ribbons, and inert thread, with the bottom of the organic-LED-containing ribbon being in electrical contact with the top of the RAM-containing ribbon. The RAM-containing ribbons can be run parallel to or perpendicular (or both) the organic-LED-containing ribbons. Analog RAMs are used in this example for simplicity, other types of drive circuits, e.g. SRAMs could also be used. When run parallel to the organic-LED-containing ribbons, electrical contacts can be made indirectly by interconnect ribbons or interconnect threads. Thus the textile may contain ribbons with memory circuitry and conductors for addressing the memory circuitry.

As used herein, the terms "in electrical contact" and "in direct or indirect electrical contact" both include direct contact between ribbons, and indirect contact where one or more other ribbons, threads, wires, or other conductive elements are used to indirectly connect the ribbons. Devices within ribbons are generally directly or indirectly connect to surface contacts of those ribbons (e.g. they may be electrically connected through other devices).

As it applies to inorganic examples, FIG. 1 shows a portion of an electronic textile (part of a display in this example) with side view of a segment of an organic-LED (OLED)-containing ribbon 12 with a sub-pixel (e.g. red) LED, woven with an inorganic RAM-containing ribbon 14, and an inert thread 16 (both in cross-section). A color display can have sets of red, green, and blue org-LED-containing ribbons, and the three ribbons together can make up a line of a (e.g. 1,024) pixels. The RAM-containing ribbon 14 here runs perpendicular to the OLED-containing ribbon 12, and parallel to the inert thread 16. The RAM-containing ribbon 14 has two surface contacts (18, 20) for making electrical contact with OLED ribbon surface contacts (22, 24) on the bottom of the OLED-containing ribbons. The RAM-containing ribbon here has a Y-line 26 (e.g. a wordline), a secondary voltage conductor 28 and a ground conductor 30 running the length of the ribbon. Here a RAM-containing ribbon 14 makes contact to an OLED in OLED ribbon 12 (e.g. one OLED in a row of OLEDs in multiple OLED ribbons) of one color (one RAM-containing ribbon could make contact with OLEDs of more than one color). The dimensions of OLEDs here are not patterned in the OLEM (organic light emitting material), but are determined by current flowing between the bottom OLED contact and the top transparent conductor. By using an analog RAM 32, current through each sub-pixel can be controlled by an analog voltage on the gate of a TFT (not shown) in RAM 32, to control the amount of light emitted by that sub-pixel, and controlling the three sub-pixels (e.g. red, green, and blue) in a pixel can control the color and intensity of that pixel. The inorganic analog RAM (e.g. an inorganic TFT and a capacitor) can be used to control a sub-pixel, but such an arrangement generally consumes significantly greater power, and an SRAM is preferred. Similarly, several (e.g. 5) digital RAMs may be used to control a sub-pixel, and instead of an analog RAM. Generally, SRAMs, DRAMs, etc. may be used. The OLED-containing ribbon 12 generally has both a transparent conductor layer (e.g. ITO) and an X-line conductor (e.g. a bitline) running its length (not shown in this figure).

Figure 2:
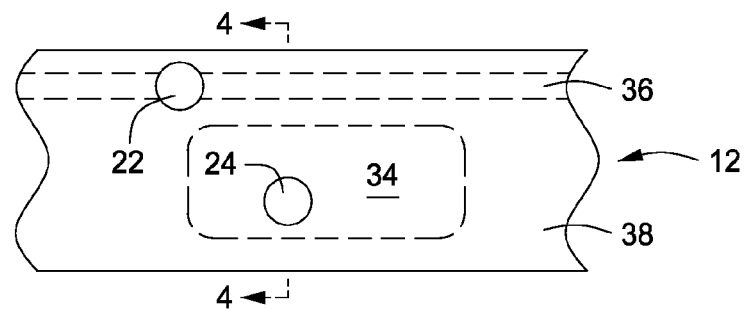
FIG. 2 shows a bottom view of a segment of the LED-containing ribbon.

As it applies to inorganic examples, FIG. 2 shows a bottom view of a segment of the organic-LED-containing ribbon 12. Two surface contacts (22, 24) on the bottom of ribbon 12 are for making electrical contact with surface contacts on the top of the RAM-containing ribbon 14. The OLED surface contact 24 is electrically connected to the bottom of the OLED 34, and the X-line contact 22 is connected to the X-line conductor 36 (e.g. bitline). Other than the exposed portion of surface contacts (22, 24), the bottom of the ribbon 12 is covered with OLED bottom insulator 38.

Figure 3:
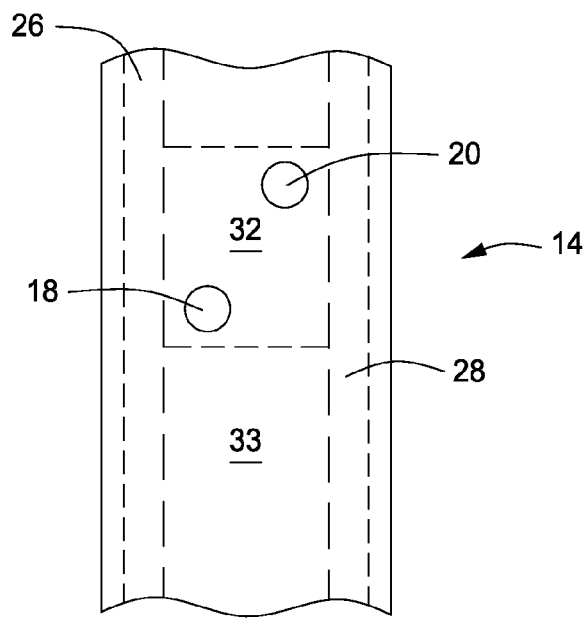
FIG. 3 shows a top view of a segment of the RAM-containing ribbon.

As it applies to inorganic examples, FIG. 3 shows a top view of a segment of the RAM-containing ribbon 14. Other than exposed portions of surface contacts (18, 20) and the RAM 32, the top of the RAM ribbon 14 is covered with RAM embedding insulator 33. Additional conductors running the length of the RAM ribbon can be added as needed, depending on details of the RAM circuit design. RAM circuits with OLEDs are mentioned is U.S. Pat. No. 6,972,526 by Abe; U.S. Pat. No. 6,563,480 by Nakamura; and U.S. Pat. No. 6,872,969 by Redecker. RAM circuits with liquid crystal displays (LCDs) are mentioned is U.S. Pat. Nos. 6,819,310 by Huang, et al.; U.S. Pat. No. 6,747,623 by Koyama; U.S. Pat. No. 6,850,217 by Huang, et al.; and U.S. Pat. No. 6,563,483 by Sakumoto. Sakumoto '483 also mentions asynchronous addressing of pixels.

Figure 4:
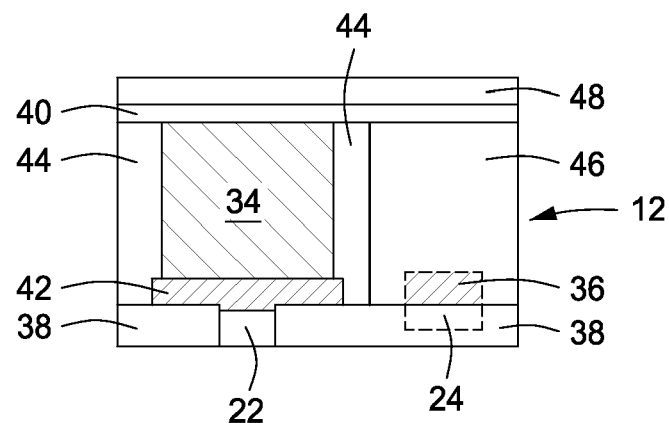
FIG. 4 shows a cross-section view of a segment of the LED-containing ribbon.

As it applies to inorganic examples, FIG. 4 shows a cross-section view of a segment of the organic-LED-containing ribbon. The ITO layer 40 provides the voltage bus and is in electrical contact with the OLED 34. OLED surface contact 24 provides the bottom contact to OLED 34 through OLED bottom plate 42. As mentioned above, the dimensions of OLEDs here are not patterned in the OLEM, but are determined by current flowing between the bottom OLED contact and the top conductor, and thus organic light emitting material without significant current 44 does not emit. The X conductor 36 is embedded in OLED side insulation 46, and the ITO layer 40 is covered with OLED top insulation 48.

Figure 5:
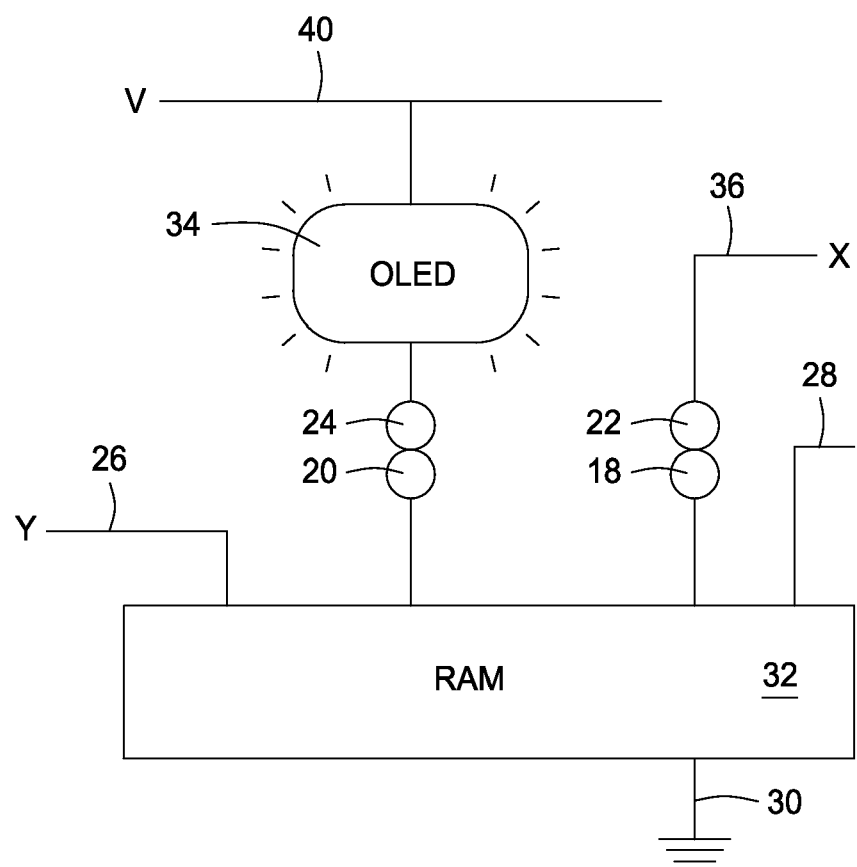
FIG. 5 shows a circuit arrangement for such a sub-pixel.

As it applies to inorganic examples, FIG. 5 shows a simplified circuit arrangement for such a sub-pixel. The transparent conducting ITO layer 40 provides voltage bus V, the OLED 34, and X-line 36, and OLED ribbon contacts (22, 24) are in the OLED ribbon 12. The Y-line 26, secondary voltage conductor 28, ground conductor 30, inorganic RAM 32, and the RAM ribbon surface contacts (18, 20) are in the RAM ribbon 14. The current flow through the analog RAM 32 determines the brightness of the sub-pixel OLED 34.

As it applies to organic examples, FIG. 1 shows a portion of an electronic textile (part of a display in this example) with side view of a segment of an organic-LED (OLED)-containing ribbon 12 with a sub-pixel (e.g. red) LED, woven with an organic RAM-containing ribbon 14, and an inert thread 16 (both in cross-section). A color display can have sets of red, green, and blue organic-LED-containing ribbons, and the three ribbons together can make up a line of a (e.g. 1,024) pixels. The RAM-containing ribbon 14 here runs perpendicular to the OLED-containing ribbon 12, and parallel to the inert thread 16. The RAM-containing ribbon 14 has two surface contacts (18, 20) for making electrical contact with OLED ribbon surface contacts (22, 24) on the bottom of the OLED-containing ribbons. The RAM-containing ribbon here has a Y-line 26 (e.g. a wordline), a secondary voltage conductor 28 and a ground conductor 30 running the length of the ribbon. Here a RAM-containing ribbon 14 makes contact to an OLED in OLED ribbon 12 (e.g. one OLED in a row of OLEDs in multiple OLED ribbons) of one color (one RAM-containing ribbon could make contact with OLEDs of more than one color). The dimensions of OLEDs here are not patterned in the OLEM (organic light emitting material), but are determined by current flowing between the bottom OLED contact and the top conductor. By using an analog RAM 32, current through each sub-pixel can be controlled by an analog voltage on the gate of a TFT (not shown) in RAM 32, to control the amount of light emitted by that sub-pixel, and controlling the three sub-pixels (e.g. red, green, and blue) in a pixel can control the color and intensity of that pixel. The organic analog RAM (e.g. an organic TFT and a capacitor) can be used to control a sub-pixel, but such an arrangement generally consumes significantly greater power, and an SRAM is preferred. There is development work being done on organic RAMs, and they are a possibility for future electronic textiles. Similarly, several (e.g. 5) digital RAMs may be used to control a sub-pixel, and instead of an analog RAM. Generally, SRAMs, DRAMs, etc. may be used. The OLED-containing ribbon 12 generally has both a transparent conductor layer (e.g. ITO) and an X-line conductor (e.g. a bitline) running its length (not shown in this figure).

As it applies to organic examples, FIG. 2 shows a bottom view of a segment of the organic-LED-containing ribbon 12. Two surface contacts (22, 24) on the bottom of ribbon 12 are for making electrical contact with surface contacts on the top of the RAM-containing ribbon 14. The OLED surface contact 24 is electrically connected to the bottom of the OLED 34, and the X-line contact 22 is connected to the X-line conductor 36 (e.g. bitline). Other than the exposed portion of surface contacts (22, 24), the bottom of the ribbon 12 is covered with OLED bottom insulator 38.

As it applies to organic examples, FIG. 3 shows a top view of a segment of the RAM-containing ribbon 14. Other than exposed portions of surface contacts (18, 20) and the RAM 32, the top of the RAM ribbon 14 is covered with RAM embedding insulator 33. Additional conductors running the length of the RAM ribbon can be added as needed, depending on details of the RAM circuit design. RAM circuits with OLEDs are mentioned is U.S. Pat. No. 6,972,526 by Abe; U.S. Pat. No. 6,563,480 by Nakamura; and U.S. Pat. No. 6,872,969 by Redecker. RAM circuits with liquid crystal displays (LCDs) are mentioned is U.S. Pat. No. 6,819,310 by Huang, et al.; U.S. Pat. No. 6,747,623 by Koyama; U.S. Pat. No. 6,850,217 by Huang, et al.; and U.S. Pat. No. 6,563,483 by Sakumoto. Sakumoto '483 also mentions asynchronous addressing of pixels.

As it applies to organic examples, FIG. 4 shows a cross-section view of a segment of the organic-LED-containing ribbon. The ITO layer 40 provides the voltage bus and is in electrical contact with the OLED 34. OLED surface contact 24 provides the bottom contact to OLED 34 through OLED bottom plate 42. As mentioned above, the dimensions of OLEDs here are not patterned in the OLEM, but are determined by current flowing between the bottom OLED contact and the top transparent conductor, and thus organic light emitting material without significant current 44 does not emit. The X conductor 36 is embedded in OLED side insulation 46, and the ITO layer 40 is covered with OLED top insulation 48.

As it applies to organic examples, FIG. 5 shows a simplified circuit arrangement for such a sub-pixel. The transparent conducting ITO layer 40 provides voltage bus V, the OLED 34, and X-line 36, and OLED ribbon contacts (22, 24) are in the OLED ribbon 12. The Y-line 26, secondary voltage conductor 28, ground conductor 30, organic RAM 32, and the RAM ribbon surface contacts (18, 20) are in the RAM ribbon 14. The current flow through the analog RAM 32 determines the brightness of the sub-pixel OLED 34.

Co-filed provisional application entitled "Electronic Textiles with Electronic Devices on Ribbons" is hereby incorporated by reference herein.

Although the present invention and its advantages have been described above, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification, but only by the claims.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method of assembling a textile display; comprising:
   Providing ribbons containing display-devices;
   Providing ribbons containing organic TFTs; and
   placing said display-device containing ribbons in electrical contact with said organic TFT ribbons to provide a textile display.

2. The method of claim 1, wherein said organic TFTs are lithography fabricated.

3. The method of claim 1, wherein said textile contains digital light output control circuitry.

4. The method of claim 1, wherein said display-devices are LEDs.

5. The method of claim 1, wherein said display-devices are LCDs.

6. The method of claim 1, wherein said organic TFTs are part of a SRAM cell.

* * * * *